(12) United States Patent
Wasshuber

(10) Patent No.: US 7,550,343 B2
(45) Date of Patent: Jun. 23, 2009

(54) FORMING A SEMICONDUCTOR STRUCTURE IN MANUFACTURING A SEMICONDUCTOR DEVICE USING ONE OR MORE EPITAXIAL GROWTH PROCESSES

(75) Inventor: Christoph A. Wasshuber, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 26 days.

(21) Appl. No.: 11/456,279

(22) Filed: Jul. 10, 2006

(65) Prior Publication Data

US 2006/0244097 A1 Nov. 2, 2006

Related U.S. Application Data

(62) Division of application No. 10/714,366, filed on Nov. 13, 2003, now abandoned.

(51) Int. Cl.
H01L 29/00 (2006.01)
(52) U.S. Cl. .................. 438/221; 438/222; 438/510; 257/510
(58) Field of Classification Search .......... 438/291, 438/296, 353, 491, 400, 510, 752; 257/510
See application file for complete search history.

(56) References Cited

U.S. PATENT DOCUMENTS

| 4,998,150 | A | | 3/1991 | Rodder et al. |
|---|---|---|---|---|
| 5,010,034 | A | * | 4/1991 | Manoliu .................. 438/207 |
| 5,298,452 | A | * | 3/1994 | Meyerson .................. 438/508 |
| 5,554,562 | A | | 9/1996 | Chang et al. |
| 6,362,510 | B1 | * | 3/2002 | Gardner et al. ............ 257/374 |
| 6,399,450 | B1 | | 6/2002 | Yu |
| 6,504,210 | B1 | * | 1/2003 | Divakaruni et al. ......... 257/344 |
| 6,613,626 | B1 | * | 9/2003 | Hsu ...................... 438/217 |
| 6,727,567 | B2 | | 4/2004 | Bastek et al. |
| 6,774,000 | B2 | * | 8/2004 | Natzle et al. .............. 438/300 |
| 6,903,384 | B2 | | 6/2005 | Hsu et al. |
| 2003/0104222 | A1 | | 6/2003 | Ono et al. |

OTHER PUBLICATIONS

Internet Web Document about CMOS technology by Wikipedia/Org (4 pages).*

* cited by examiner

Primary Examiner—Thinh T Nguyen
(74) Attorney, Agent, or Firm—Robert D. Marshall, Jr.; Wade J. Brady, III; Frederick J. Telecky, Jr.

(57) ABSTRACT

In one embodiment, a semiconductor structure used in manufacturing a semiconductor device includes a substrate layer. The structure also includes first and second isolation regions formed by etching an oxide layer provided on the substrate layer to define an epitaxial growth surface of the substrate layer for epitaxial growth of a substrate material on the epitaxial growth surface between the first and second isolation regions. The structure also includes an active region that includes the epitaxially-grown substrate material between the first and second isolation regions, the active region formed by epitaxially growing the substrate material on the epitaxial growth surface of the substrate layer.

8 Claims, 3 Drawing Sheets

FORMING A SEMICONDUCTOR STRUCTURE IN MANUFACTURING A SEMICONDUCTOR DEVICE USING ONE OR MORE EPITAXIAL GROWTH PROCESSES

This is a divisional application of Ser. No. 10/714,366 filed Nov. 13, 2003.

TECHNICAL FIELD

This invention relates generally to semiconductor structures, and more particularly to forming a semiconductor structure in manufacturing a semiconductor device using one or more epitaxial growth processes.

BACKGROUND

Integrated circuit fabrication often includes forming one or more isolation regions to define one or more active regions on a silicon or other substrate of a semiconductor structure. One way to form an isolation region is to form one or more trenches in the substrate using one or more etching processes while masking the substrate over what is to be the active region. As an example, this process may be referred to as shallow trench isolation (STI). Subsequent to formation, a liner oxide layer may be formed in the trenches and the trenches may be filled with a fill oxide to form the isolation regions. The etching processes for forming the isolation regions may lead to problems that may degrade transistor performance. These problems may include a step-height problem associated with the STI process (i.e. the "1/w effect"), stress created by the liner oxide used during the STI process, strained channels underlying a gate formed on the semiconductor structure, or other problems.

Furthermore, the substrate and active regions may be doped with a dopant material such as boron using an implant process. An anneal process may be used to activate the dopant material, which may cause undesirable levels of diffusion of the dopant material in the substrate. The combined implant and anneal process for doping the active region may result in a doping gradient (i.e. the variation of dopant concentration with depth) that is not as steep as desired as well as other problems.

Integrated circuit fabrication may also include forming a transistor on an active region of the semiconductor structure. One way to form a transistor on the surface of the active region is to implant dopant material into portions of the active region to form a source and drain of the transistor. A gate may be formed on a pad layer on the surface of the active region over a channel formed between the source and the drain. Using previous techniques to form the transistor may degrade or otherwise limit performance of the transistor as a result of diffusion of the dopant material during an anneal process for activating the dopant material. Furthermore, the geometry of transistors formed according to previous techniques may limit or otherwise degrade transistor performance.

SUMMARY OF THE INVENTION

According to the present invention, disadvantages and problems associated with previous techniques for forming semiconductor structures in manufacturing semiconductor devices may be reduced or eliminated.

In one embodiment, a semiconductor structure used in manufacturing a semiconductor device includes a substrate layer. The semiconductor structure also includes first and second isolation regions formed by etching an oxide layer provided on the substrate layer to define an epitaxial growth surface of the substrate layer for epitaxial growth of a substrate material on the epitaxial growth surface between the first and second isolation regions. The semiconductor structure also includes an active region including the epitaxially-grown substrate material between the first and second isolation regions, the active region formed by epitaxially growing the substrate material on the epitaxial growth surface of the substrate layer.

In one embodiment, the semiconductor structure further includes a transistor that includes a pad layer provided on the active region and a gate formed on the pad layer. The transistor may include a substantially vertical isolation layer formed on each side of the gate and adapted to laterally isolate the gate. The transistor may also include an extender epitaxially grown on the active region on each side of the gate, the isolation layer on each side of the gate laterally isolating the gate from the corresponding extender. Each extender may include either a p-type material or an n-type material and be adapted to serve as either a source or a drain for the transistor. The source and the drain may be formed independent of any process for implanting either a p-type material or an n-type material into the active region.

Particular embodiments of the present invention may provide one or more technical advantages. For example, forming a semiconductor structure according to the present invention may change the production paradigm by reducing or eliminating the need for the implant and anneal steps. In certain embodiments, etching an oxide layer deposited on a substrate layer to form one or more isolation regions and epitaxially growing a substrate material on an epitaxial growth surface defined by the isolation regions may improve transistor performance because epitaxial growth may be a relatively controlled process. In certain embodiments, this may reduce or eliminate an STI step-height problem resulting from previous techniques for forming isolation regions to define active regions. Additionally, in certain embodiments, the relatively controlled epitaxial growth process may be preferable when forming smaller semiconductor devices because the added control may improve scaling. Furthermore, in certain embodiments, previous STI etch and fill techniques for forming the isolation regions may involve etching a trench for each isolation region and introducing a liner oxide layer in each of the trenches, which may lead to undesirable stress in the semiconductor structure. In certain embodiments, the liner oxide layer may not be introduced, which may reduce or eliminate the undesirable stress.

In certain embodiments, one or more dopant materials may be introduced into the epitaxially-grown substrate material as the substrate material is epitaxially grown, which may eliminate the need for the relatively imprecise implant and anneal steps. In certain embodiments, reducing or eliminating the need to introduce dopants using the implant step may reduce or eliminate problems related to diffusion of dopant material during the anneal step. For example, in certain embodiments, epitaxial growth allows the dopant material to be relatively precisely introduced into the substrate material. In certain embodiments, this, along with the elimination of the need for the implant and anneal steps, may provide more freedom to tailor the doping gradient as desired. For example, in certain embodiments, introducing the dopant material into the substrate material as it is epitaxially grown may allow the doping gradient to be made steeper. In certain embodiments, the epitaxial growth process may provide a relatively controlled process for introducing dopant material into the substrate material. In certain embodiments, the epitaxial growth process may be a substantially self-aligned process when introducing dopant material into the substrate material, whereas the implant and anneal steps may suffer from misalignment. Additionally, in certain embodiments, the dopant material may include germanium (Ge). In these embodiments, the ability to relatively precisely introduce Ge in the epitaxially-grown substrate material may improve stress-engineering of the semiconductor structure.

In certain embodiments, forming a transistor in the semiconductor structure using one or more substantially vertical isolation layers formed on each side of a gate of the transistor and one or more epitaxially-grown extenders grown on each side of the gate and adapted to serve as a source and drain of the transistor may improve transistor performance. For example, in certain embodiments, reducing or eliminating the need for the implant or anneal process for introducing a dopant material into the active region to form the source and drain of the transistor may reduce or eliminate problems associated with diffusion of the dopant material. Furthermore, in certain embodiments, using the epitaxially-grown extenders to form the source and the drain of the transistor above the substrate surface may provide a better geometry for the transistor, which may improve transistor performance.

Certain embodiments of the present invention may provide some, all, or none of the above technical advantages. Certain embodiments may provide one or more other technical advantages, one or more of which may be readily apparent to those skilled in the art from the figures, descriptions, and claims included herein.

BRIEF DESCRIPTION OF THE DRAWINGS

For a more complete understanding of the present invention and features and advantages thereof, reference is now made to the following description, taken in conjunction with the accompanying drawings, in which.

DESCRIPTION OF EXAMPLE EMBODIMENTS

FIGS. 1A-1D illustrate an example process for forming a semiconductor structure 10 in manufacturing a semiconductor device, the semiconductor structure 10 formed using one or more epitaxial growth processes and having one or more isolation regions separating one or more active regions. In one embodiment, the semiconductor device includes a complementary metal oxide semiconductor (CMOS) device, such as a p-channel metal oxide semiconductor (PMOS) device or n-channel metal oxide semiconductor (NMOS) device.

Figure 1A:
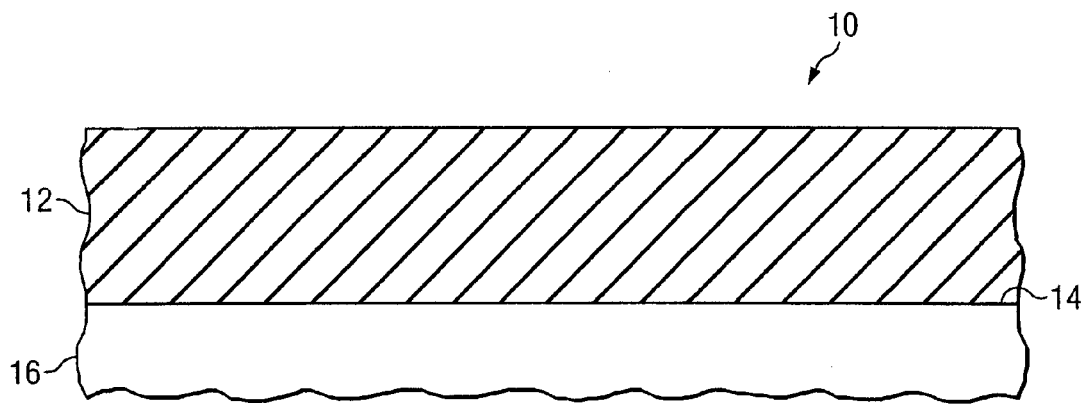
FIGS. 1A-1D illustrate an example process for forming a semiconductor structure in manufacturing a semiconductor device, the semiconductor structure formed using one or more epitaxial growth processes and having one or more isolation regions separating one or more active regions.

As shown in FIG. 1A, an oxide layer 12 may be provided on a surface 14 of a silicon or other substrate layer 16. While surface 14 is illustrated as being substantially flat, surface 14 may have any suitable profile according to particular needs or manufacturing tolerances, for example. Oxide layer 12 may be grown on surface 14 of substrate layer 16 using any suitable technique, deposited on surface 14 of substrate layer 16 using any suitable technique, or otherwise provided on surface 14 of substrate layer 16. Oxide layer 12 may include silicon dioxide ($SiO_2$) or any other material suitable for use as an oxide layer. In one embodiment, oxide layer 12 is approximately 400 nm thick, although the present invention contemplates oxide layer 12 having any suitable thickness according to particular needs.

Figure 1B:
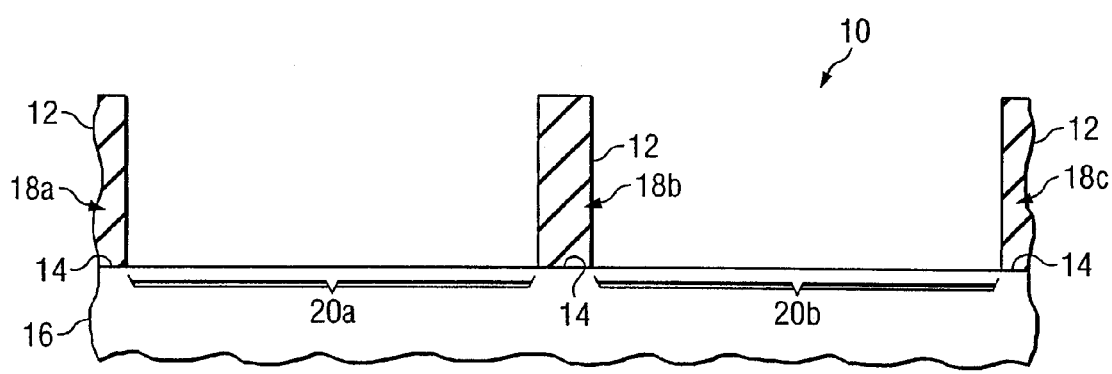

As shown in FIG. 1B, oxide layer 12 may be etched to form isolation regions 18a, 18b, and 18c to define epitaxial growth surfaces 20a and 20b of substrate layer 16 for epitaxial growth of a substrate material on epitaxial growth surfaces 20a and 20b between isolation regions 18a, 18b, and 18c. For purposes of this description, isolation regions 18a, 18b, and 18c may be referred to in the singular as isolation region 18 and in the plural as isolation regions 18. Although three isolation regions 18 defining two epitaxial growth surfaces 20 are illustrated, the present invention contemplates forming any number of isolation regions 18 defining any number of epitaxial growth surfaces 20 according to particular needs. Additionally, although isolation regions 18 are illustrated as having a substantially rectangular pillar shape, the present invention contemplates each isolation region 18 having any suitable shape, according to particular needs or manufacturing tolerances. Oxide layer 12 may be etched to form isolation regions 18 using any suitable etching process such as a wet etching process, a dry etching process, or an ion milling process, for example. In one embodiment, it is desirable to etch completely through oxide layer 12 to form isolation regions 18 such that epitaxial growth surfaces 20 substantially lack the material of oxide layer 12. Although epitaxial growth surfaces 20 are illustrated as being substantially flat, epitaxial growth surfaces 20 may have any suitable profile according to particular needs or manufacturing tolerances, for example.

Figure 1C:
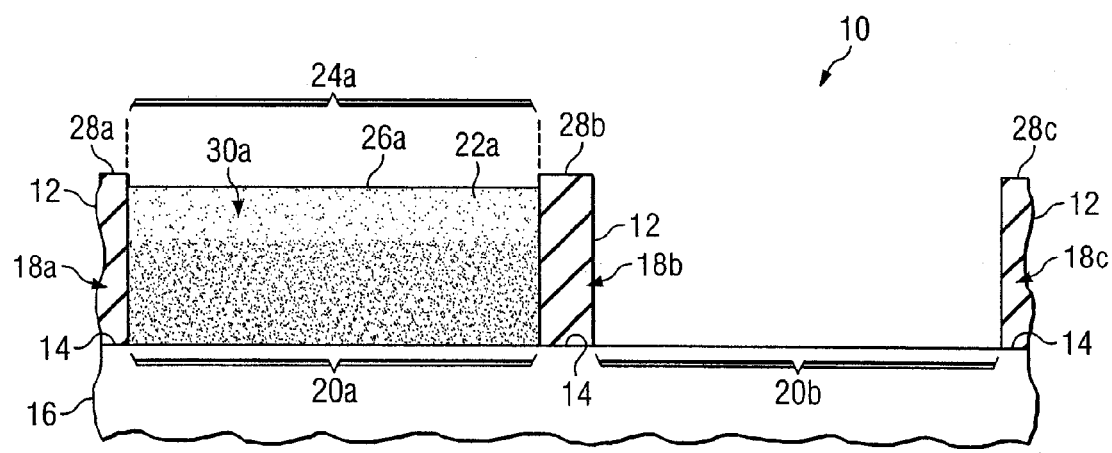
Figure 1D:
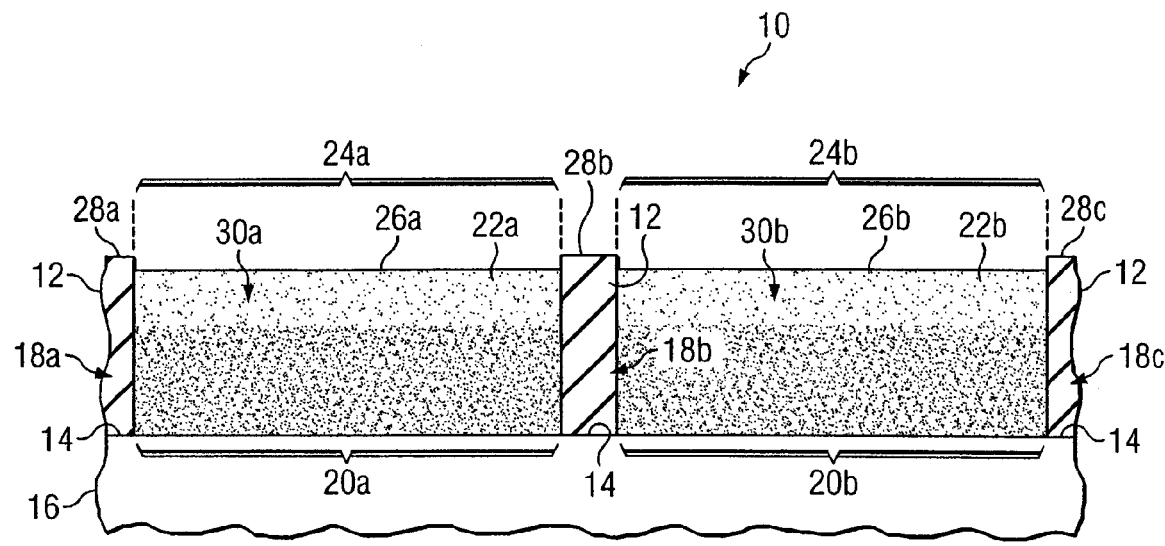

As shown in FIG. 1C, substrate material 22a may be epitaxially grown on epitaxial growth surface 20a of substrate layer 16 to form an active region 24a that includes epitaxially-grown substrate material 22a between isolation regions 18a and 18b. As shown in FIG. 1D, substrate material 22b may be epitaxially grown on epitaxial growth surface 20b of substrate layer 16 to form an active region 24b that includes epitaxially-grown substrate material 22b between isolation regions 18b and 18c. An active region 24 may be a location in semiconductor structure 10 at which a semiconductor device, such as a transistor, may eventually be formed.

In one embodiment, epitaxial growth includes a process in which a layer of a single crystal material (e.g., silicon) is deposited on a single crystal substrate layer 16. Epitaxial growth may occur in such a way that the crystallographic structure of the substrate layer 16 is reproduced in epitaxially-grown substrate material 22. In one embodiment, epitaxial growth is implemented by using chemical vapor deposition (CVD) in an epitaxy-by-CVD process. An epitaxial growth process may include heteroepitaxy (i.e. an epitaxial deposition process in which the chemical composition of the epitaxially-grown substrate material 22 is different than the chemical composition of substrate layer 16) or homoepitaxy (i.e. an epitaxial deposition process in which the chemical composition of epitaxially-grown substrate material 22 and substrate layer 16 are the same). In one embodiment, it may be preferable to use a selective epitaxial growth process for epitaxially growing substrate material 22 on a substrate layer 16 that only partially includes a single crystal material. For example, due to the presence of isolation regions 18, which generally include an oxide material, it may be preferable to use the selective epitaxial growth process such that epitaxial growth of substrate material 22 will occur on the epitaxial growth surface 20 that includes the single crystal silicon rather than on surfaces 28 of isolation regions 18, for example.

Although surfaces 26 of active regions 24 are illustrated as being substantially flat, the present invention contemplates surfaces 26 having any suitable profiles according to particular needs or manufacturing, for example. Substrate material 22 may be epitaxially grown such that surfaces 26 of active regions 24 are substantially flush with surfaces 28 of isolation regions 18, recessed from surfaces 28 of isolation regions 28, or elevated from surfaces 28 of isolation regions 28. In one embodiment, it is desirable for substrate material 22 to be epitaxially grown such that surfaces 26 of active regions 24 are slightly recessed from surfaces 28 of isolation regions 18 to ensure that adjacent active regions 24 (i.e. active regions 24a and 24b) are completely separated by an isolation region 18 (i.e. isolation region 18b).

Epitaxially-grown substrate materials 22a and 22b may include the same or different materials according to particular needs. In one embodiment, epitaxially-grown substrate materials 22a and 22b include substantially the same material as substrate layer 16; however, the present invention contemplates epitaxially-grown substrate material 22 including any suitable material according to particular needs. In one embodiment, one or more dopant materials 30 are introduced into substrate material 22 as substrate material 22 is epitaxially grown on epitaxial growth surface 20 of substrate layer 16, epitaxially-grown substrate material 22 including the one or more dopant materials 30. The amounts and types of dopant materials 30 introduced into epitaxially-grown substrate material 22 may be adjusted as substrate material 22 is epitaxially grown. This may allow in situ doping of active region 24 as substrate material 22 is epitaxially grown. Although a particular dopant concentration of dopant material 30 in substrate material 22 providing a particular dopant profile is illustrated, the present invention contemplates any suitable dopant concentration of dopant material 30 in substrate material 22 having any suitable dopant profile according to particular needs.

In one embodiment, such as when the semiconductor device is a CMOS device for example, the epitaxially-grown substrate material 22 forms a p-type well or an n-type well underlying active region 24. In this embodiment, p-type or n-type dopant material 30 is introduced into substrate material 22 as substrate material 22 is epitaxially-grown to form either a p-type well or an n-type well, respectively. P-type dopant material 30 may include boron or any other material suitable for use as a p-type dopant material, and n-type dopant material 30 may include phosphorus or any other material suitable for use as an n-type dopant material.

The in situ doping capability may enable doping of epitaxially-grown substrate material 22 to be tailored in any suitable manner according to particular needs. This may allow a manufacturer of semiconductor structure 10 to engineer the doping gradient (i.e. the variation in dopant concentration with depth) in epitaxially-grown substrate material 22 according to any suitable criteria. For example, it may be desirable for dopant levels to be low near surfaces 26 of active regions 24, but then sharply increase at some predetermined distance below surfaces 26 of active regions 24, which may result in a desirable steep doping gradient. Epitaxially growing substrate material 22 while introducing one or more dopant materials 30 may allow any suitable dopant profile to be achieved.

In one embodiment, substrate material 22a is epitaxially grown on epitaxial growth surface 20a (as illustrated in FIG. 1C) and substrate material 22b is epitaxially grown on epitaxial growth surface 20b (as illustrated in FIG. 1D) substantially simultaneously. For example, in an embodiment in which the same dopant material 30 is introduced into epitaxially-grown substrate materials 22a and 22b (e.g., both form p-wells or both form n-wells), substrate materials 22a and 22b may be epitaxially grown while dopant material 30 is introduced in a substantially continuous process.

In an alternative embodiment, substrate material 22a is epitaxially grown on epitaxial growth surface 20a (as illustrated in FIG. 1C) and substrate material 22b is epitaxially grown on epitaxial growth surface 20b (as illustrated in FIG. 1D) in separate processes. This may be desirable, for example, if different dopant materials 30 are to be introduced into epitaxially-grown substrate materials 22a and 22b as substrate materials 22a and 22b are epitaxially grown (e.g., epitaxially-grown substrate material 22a forms an n-well and epitaxially-grown substrate material 22b forms a p-well, or vice-versa). In this embodiment, a first dopant material 30a (e.g., a p-type material) is introduced into substrate material 22a as substrate material 22a is epitaxially grown on epitaxial growth surface 20a of substrate layer 16 between isolation regions 18a and 18b to form active region 24a, epitaxially-grown substrate material 22a including first dopant material 30a. Epitaxial growth surface 20b of substrate layer 16 may be masked while substrate material 22a is epitaxially grown on epitaxial growth surface 20a of substrate layer 16 and first dopant material 30a is introduced into epitaxially-grown substrate material 22a. Additionally, in this embodiment, a second dopant material 30b (e.g., an n-type material) may be introduced into substrate material 22b as substrate material 22b is epitaxially grown on epitaxial growth surface 20b of substrate layer 16 between isolation regions 18b and 18c to form active region 24b, epitaxially-grown substrate material 22b including second dopant material 30b. Active region 24a may be masked while substrate material 22b is epitaxially grown on epitaxial growth surface 20b of substrate layer 16 and second dopant material 30b is introduced into epitaxially-grown substrate material 22b. This embodiment may allow different dopant materials 30 to be introduced into adjacent epitaxially-grown substrate materials 22. For example, in a CMOS device for example, every other epitaxially-grown substrate material 22 may form a p-well and each intervening epitaxially-grown substrate material 22 may form an n-well.

Previous techniques for forming one or more isolation regions and one or more active regions of semiconductor structures include using an STI process in which an isolation region is formed by etching a trench in the substrate layer and filling the trench with an oxide material to define an adjacent active region of the semiconductor structure. This STI etch and fill process may be associated with certain disadvantages. As an example, the STI etch and fill process may result in an STI step-height problem, or what is often referred to as the "l/w effect." The step-height problem may include a non-uniform surface of the semiconductor structure that results from the STI etch and fill process. For example, within a single semiconductor structure, surfaces of some active regions may be recessed from surfaces of adjacent isolation regions, surfaces of some active regions may be flush with surfaces of adjacent isolation regions, and surfaces of some active regions may be elevated from surfaces of adjacent isolation regions. This non-uniformity may result from a chemical mechanical polish (CMP) step used in the STI etch and fill process, which may remove the oxide material used for filling the trenches to form the isolation regions inconsistently across the surface of the semiconductor structure. Non-uniformity on the surface of the semiconductor structure may create leaks in the semiconductor device, possibly reducing transistor or other device performance.

As another example, the STI etch and fill process may result in stress or other strain in the semiconductor device.

The stress or strain may be created in the active region of the semiconductor structure due to the need for a liner oxide layer in the trench formed during the STI etch and fill process prior to filling the trench, for example. As another example, the STI etch and fill process may inadequately scale because as semiconductor device size decreases, it may be necessary to reduce the size of the isolation regions. Typically, in such smaller devices, trench width will decrease but trench depth may remain the same, which may increase the aspect ratio for each trench and increase the difficulty of properly filling each trench.

In contrast, in one embodiment of the present invention, isolation regions 18 and active regions 24 may be formed independent of any STI process in which isolation regions are formed by etching trenches in the substrate layer and filling the trenches with an oxide material to define active regions between the isolation regions. This may reduce or eliminate certain disadvantages associated with previous techniques. For example, epitaxial growth may be a substantially controlled process relative to the STI etch and fill process for forming isolation regions and active regions. As another example, using an epitaxial growth process may reduce or eliminate stress in the active region associated with previous techniques. As another example, using the epitaxial growth process may reduce or eliminate the STI step-height problem associated with previous techniques. For example, because epitaxial growth may be a relatively controlled process, it may be possible to ensure that surfaces 26 of active regions 24 and surfaces 28 of adjacent isolation regions 18 have a substantially consistent relationship (i.e. substantially all surfaces 26 of active regions 24 are recessed from surfaces 28 of adjacent isolation regions 18, substantially all surfaces 26 of active regions 24 are recessed from surfaces 28 of adjacent isolation regions 18, or substantially all surfaces 26 of active regions 24 are recessed from surfaces 28 of adjacent isolation regions 18) such that the surface of semiconductor structure 10 is substantially uniform, if desired.

Previous techniques for forming isolation regions and adjacent active regions, such as the STI etch and fill process, may use an implant process for introducing dopant material into the substrate material to form a p-well or n-well, which may be a relatively imprecise process. A subsequent anneal process may also be used to activate the dopant material introduced during the implant process. The anneal process may involve exposing the semiconductor structure to high temperatures, which may cause undesirable diffusion of the dopant material in the substrate material. This may be particularly true as the size of semiconductor devices decreases, requiring the size of the semiconductor structure to decrease as well. Furthermore, using the implant and anneal processes to introduce dopant material into the substrate material may result in an unsatisfactory doping gradient that is not as steep as desired.

In contrast, in one embodiment of the present invention, semiconductor structure 10 is formed substantially independent of an implant process for introducing dopant material 30 into active region 24 and an anneal process for activating dopant material 30. For example, because dopant material 30 may be introduced into substrate material 22 as substrate material 22 is epitaxially grown, the need for the implant and anneal processes may be reduced or eliminated. Thus, the diffusion associated with the implant and anneal processes may be reduced or eliminated. Introducing dopant materials 30 during epitaxial growth of substrate material 22 may allow engineering of dopant material amounts at specific locations in substrate material 22, such as a channel for example. By introducing dopant material 30 where desired and at the desired amounts, the gradient of dopant material may be improved, which may improve transistor performance. For example, it may be desirable for dopant material 30 to have a relatively steep dopant material gradient.

Previous techniques involving the implant and anneal processes may also be associated with misalignment problems. As an example, assume a semiconductor structure includes two active regions separated by an isolation region. It may be desirable to introduce different types of dopant materials into the substrate material of the active regions (e.g., p-type dopant material in one active region and n-type dopant material in the other). Thus, it may be necessary to mask one active region while implanting dopant material in the substrate material of the other active region. The mask used may overlap a portion of the isolation region separating the two active regions. It may be desirable for the mask to cover one half of the isolation region; however, due to certain manufacturing tolerances or manufacturing errors, the mask may be misaligned each time it is applied such that the mask is displaced from the center of the isolation region, by approximately 30 nm to approximately 70 nm for example. In certain cases, the isolation region may only be approximately 100 nm wide, which means that the mask may entirely miss the isolation region. This may cause flaws in the implant process, which could lead to yield problems or reduce the effectiveness of isolation in the resulting semiconductor device. By introducing dopant material 30 into substrate material 22 during epitaxial growth of substrate material 22, misalignment problems may be reduced or eliminated because the epitaxial growth process may be selective to substrate material 22 such that epitaxial growth will not occur on the oxide material of isolation regions 18.

In one embodiment, dopant material 30 may include germanium (Ge). For example, it may be desirable to introduce Ge into substrate material 22 during epitaxial growth of substrate material 22, which may introduce desirable strain into semiconductor structure 10. Ge may be introduced into substrate material 22 through a certain range of epitaxial growth of substrate material 22, but substrate material 22 may be epitaxially grown as only silicon (i.e. without any Ge) near surface 26 of active region 24. Ge may cause strain in the silicon material near surface 26 of active region 24, which may be desirable in certain PMOS devices, for example. Introducing Ge during epitaxial growth of substrate material 22 may improve the precision of this strain as compared to the relatively imprecise implant and anneal processes and the diffusion associated with those processes.

Figure 2A:
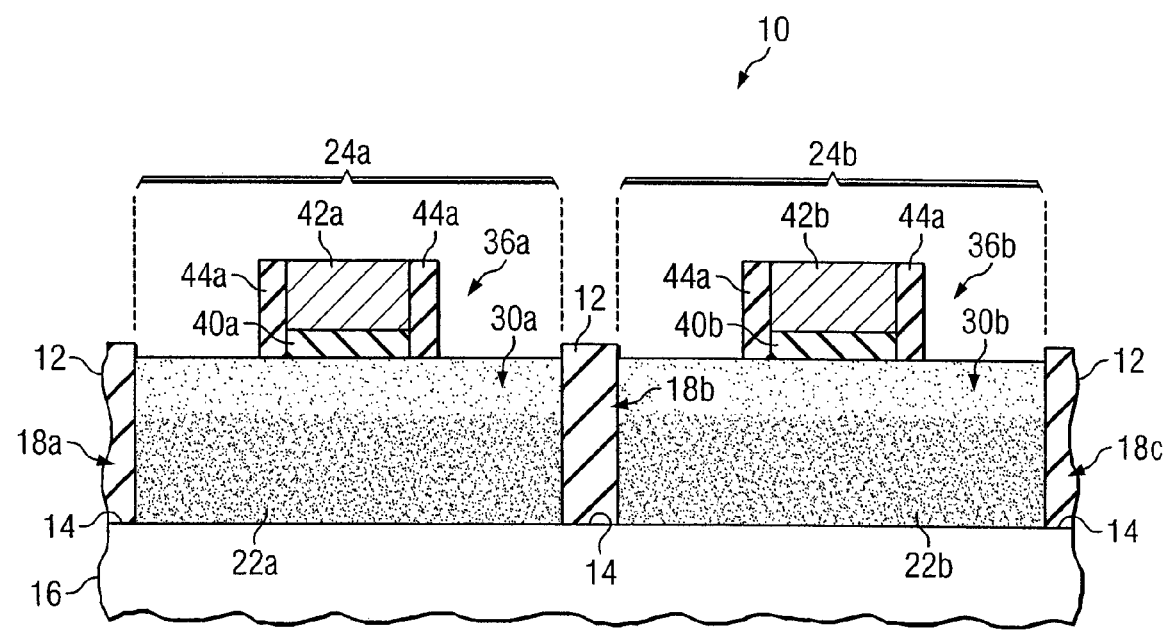
FIGS. 2A-2C illustrate an example process for forming a transistor of a semiconductor structure using an epitaxial growth process.
Figure 2B:
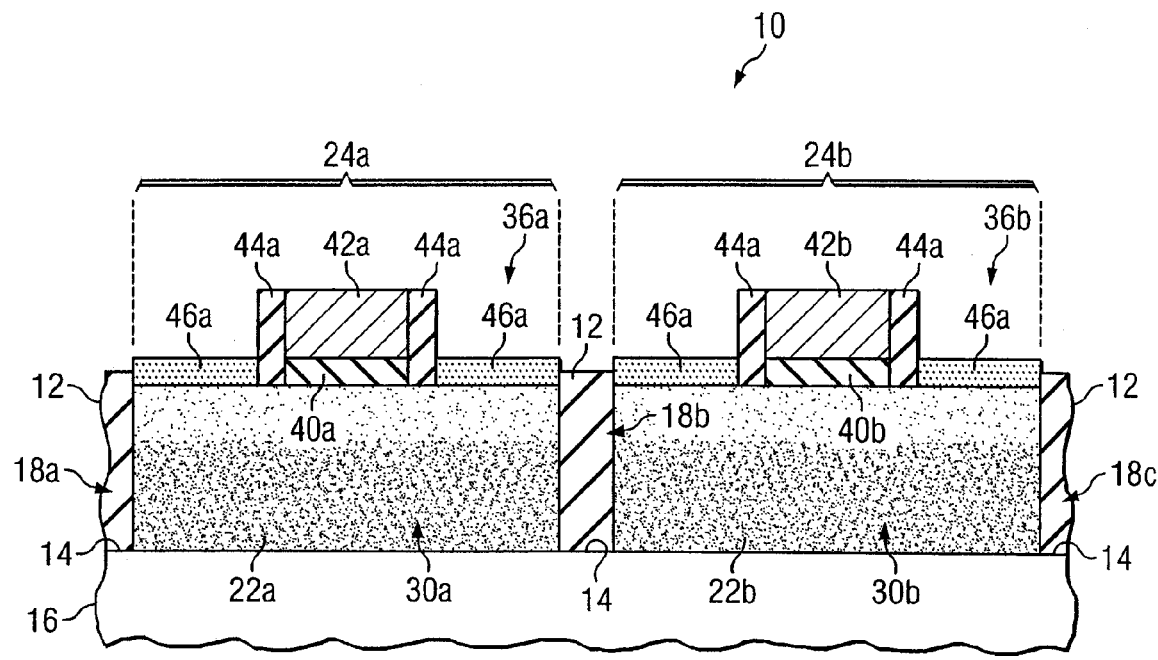
Figure 2C:
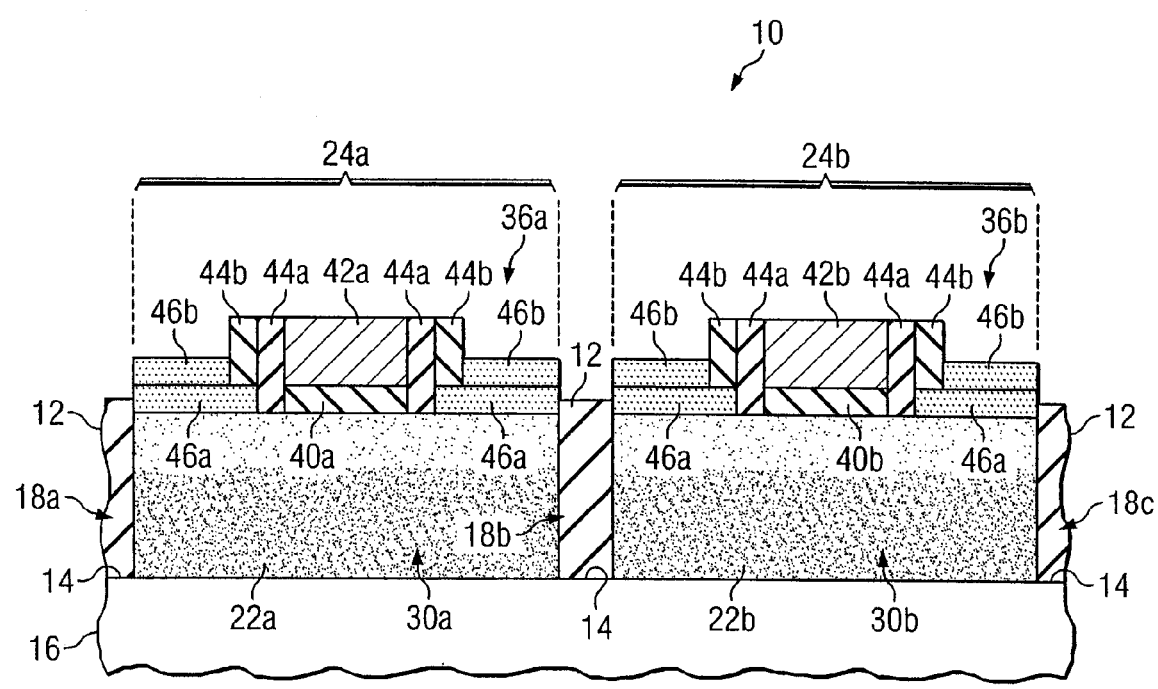

FIGS. 2A-2C illustrate an example process for forming a transistor 36 of semiconductor structure 10 using an epitaxial growth process. For example, the transistor may be used to form a semiconductor device such as a PMOS device or an NMOS device.

As shown in FIG. 2A, a pad layer 40 may be provided on each active region 24. Pad layer 40 may include an oxide material or any other material suitable for use as an insulating layer. In one embodiment, pad layer 40 has a height of approximately 1 nm; however, the present invention contemplates pad layer 40 having any suitable dimensions according to particular needs. A gate 42 may be formed on pad layer 40. Gate 42 may include polycrystalline silicon or any other material suitable for use as a gate and may be formed in any suitable manner, according to particular needs. For example, gate 42 may be formed by depositing a polycrystalline silicon or other suitable material on pad layer 40, forming a photoresist or other resist mask on the polycrystalline silicone layer where gate 42 is to be formed, etching the unmasked portions of the polycrystalline silicon layer, and removing the resist mask. In one embodiment, gate 42 has a height of approximately 100 nm; however, the present invention contemplates gate 42 having any suitable dimensions, according to particular needs. Typically, pad layer 40 substantially separates gate 42 from epitaxially-grown substrate material 22 of active region 24.

In one embodiment, a substantially vertical isolation layer 44a may be formed on each side of gate 42. The term "vertical" as used to describe substantially vertical isolation layers 44 throughout this description is meant to refer to a direction that is substantially perpendicular to surface 26 of active region 24. Isolation layers 44a may be adapted to laterally isolate gate 42 from subsequently formed "raised" source and "raised" drain of transistor 36. Each isolation layer 44a may have any suitable length and width according to particular needs. The lengths and widths of isolation layers 44a may affect performance of transistor 36. For example, wider isolation layers 44a may increase resistance of transistor 36. Thus, determining the lengths and the widths of isolation layers 44a may be an optimizable step in the fabrication of transistor 36 to achieve a desired level of resistance. In one embodiment, isolation layers 44 are approximately 5 nm to approximately 10 nm wide.

Isolation layers 44 may be formed in any suitable manner, according to particular needs. In one embodiment, gate 42 includes polycrystalline silicon, which may be oxidized to form a polyoxide layer on the sides and top of gate 42. Portions of the polyoxide layer may be removed (e.g., on a top surface of gate 42) such that only the portions of the polyoxide layer on the sides of gate 42 remain, forming isolation layers 44a. In another embodiment, a silicon dioxide layer is deposited over the top of semiconductor structure 10 and the silicon dioxide layer is etched, using an anisotropic etching chemistry for example, such that only the portions of the silicon dioxide layer on the sides of gate 42 remain, forming isolation layers 44a.

As shown in FIG. 2B, an extender 46 may be epitaxially grown on substrate material 22 of active region 24 on each side of gate 42. The isolation layer 44 on each side of gate 42 may laterally isolate gate 42 from the corresponding extender 46. In one embodiment, each extender 46 is adapted to serve as either a source or a drain of transistor 36. For example, extenders 46 may form raised sources and drains of transistor 36. By providing the source and drain to the side of gate 42 rather than under surface 26 of active region 24, gate 42 may better shield the source and the drain. Eletrostatically, this may provide a better geometry for transistor 36. Furthermore, moving the source and drain to the sides of gate 42 may reduce a short channel effect by making it more difficult for the source and the drain to capacitively couple.

A dopant material 30 may be introduced into extenders 46 as extenders 46 are epitaxially grown. For example, dopant material 30 may include either a p-type material or an n-type material. In one embodiment, extenders 46 include a p-type dopant material 30 if epitaxially-grown substrate material 22 forms an n-type well underlying active region 24, or an n-type dopant material 30 if epitaxially-grown substrate material 22 forms a p-type well underlying active region 24. However, the present invention contemplates extenders 46 including any suitable dopant material 30 according to particular needs. In one embodiment, the source and the drain of transistor 36 are formed independent of any process for implanting either a p-type material or an n-type material into active region 24, under surface 26 for example. Although a particular dopant concentration of dopant material 30 in extenders 46 is illustrated, the present invention contemplates any suitable dopant concentration of dopant material 30 in extenders 46 according to particular needs.

Extenders 46 may be epitaxially grown to any suitable height, according to particular needs. The height of extenders 46 may affect performance of transistor 36. For example, as extenders 46 increase in height, the possibility that the source and the drain may undesirably capacitively couple may increase. Thus, the height of extenders 46 may be an optimizable step during fabrication of transistor 36. Reducing overlap between extenders 46 and gate 42 may reduce the gate drain capacitance (CGD), which may be desirable. As an example, in an embodiment in which pad layer 40 has a height of approximately 1 nm, it may be desirable to epitaxially grow extenders 46 to approximately 5 nm. This may provide approximately 3 nm to approximately 5 nm of overlap between extenders 46 and gate 42. In one embodiment, it may be desirable for extenders 46 to be grown to a height that does not reach the top of gate 42.

As shown in FIG. 2C, in one embodiment, a second substantially vertical isolation layer 44b may be formed on each side of gate 42. Isolation layers 44b may be adapted to further isolate gate 42 and may each have a length that is shorter than a length of isolation layers 44a. A second extender 46b may be epitaxially grown on extender 46a on each side of gate 42, each second extender 46b including either a p-type material or an n-type material and adapted to further serve as either a source or a drain for transistor 36. For example, a second extenders 46b may include the same material as the underlying first extender 46a and may extend either the raised source or the raised drain formed by the underlying first extender 46a. The present invention contemplates forming any suitable number of additional isolation layers 44 and extenders 46 according to particular needs.

The number of isolation layers 44 and extenders 46 formed may affect performance of transistor 36. For example, as described above, it may be desirable to minimize overlap between extenders 46 and gate 42 near gate 42 to reduce the CGD. Relatively thin extenders 46 may provide certain disadvantages, however. For example, an extender 46 that is too thin may be inadequate for a subsequent silicide step for introducing metal atoms into the raised source and drain of transistor 36. For example, extenders 46 having a height of 5 nm may be too thin for the subsequent silicide step. Thus, to accommodate the desire to reduce overlap between extenders 46 and gate 42 near gate 42 yet still provide extenders 46 that are thick enough for the subsequent silicide step, it may be desirable to increase the height of the source and drain further away from gate 42. This may be accomplished by forming additional isolation layers 44 and epitaxially growing additional extenders 46 on each side of gate 42. The number of additional isolation layers 44 and extenders 46 may be adjusted to achieve optimum resistance and capacitance in transistor 36.

Although both formation of isolation regions 18 and active regions 24 and formation of transistor 36 have been described as using an epitaxial growth process, the present invention contemplates forming only the isolation regions 18 and active regions 24 using the epitaxial growth process or forming only transistor 36 using the epitaxial growth process. However, by either forming isolation regions 18 and active regions 24 using previous techniques or forming transistor 36 using previous techniques, certain advantages of the present invention may be lost. In particular, it may be undesirable to form isolation regions 18 and active regions 24 using the epitaxial growth process and subsequently forming transistor 36 using implant and anneal processes.

Although the process steps described with reference to FIGS. 1A-1D and FIGS. 2A-2C are described in a particular order, the present invention contemplates certain steps being performed in any suitable order according to particular needs. Additionally, although semiconductor structure 10 is illustrated and described as having a particular form and including particular materials, the present invention contemplates semiconductor structure 10 having any suitable form and including any suitable materials according to particular needs. Furthermore, although semiconductor structure 10 is illustrated and described as including particular layers, the present invention contemplates omission of certain layers or addition of other layers according to particular needs.

Although the present invention has been described with several embodiments, diverse changes, substitutions, variations, alterations, and modifications may be suggested to one skilled in the art, and it is intended that the invention encompass all such changes, substitutions, variations, alterations, and modifications as fall within the spirit and scope of the appended claims.

What is claimed is:

1. A method for forming a semiconductor structure in manufacturing a semiconductor device, comprising:
   providing a substrate layer;
   etching an oxide layer provided on the substrate layer to form first and second isolation regions, the first and second isolation regions defining an epitaxial growth surface of the substrate layer for epitaxial growth of a substrate material on the epitaxial growth surface between the first and second isolation regions;
   epitaxially growing the substrate material on the epitaxial growth surface of the substrate layer to form an active region comprising the epitaxially-grown substrate material between the first and second isolation regions;
   introducing a dopant material while epitaxially growing the substrate material, wherein the dopant material comprises one of an n-type material, a p-type material, and germanium; and
   adjusting an amount of the dopant material introduced while epitaxially growing the substrate material, to control a doping gradient of the dopant material in the epitaxially-grown substrate material substantially independent of:
      an implant process for introducing the dopant material into the active region; and
      an anneal process for activating the dopant material.

2. The method of claim 1, comprising forming the isolation regions and the active region independent of any shallow trench isolation (STI) process in which an isolation region is formed by etching a trench in the substrate layer and filling the trench with an oxide material to define an adjacent active region of the structure.

3. The method of claim 1, wherein the active region comprises a first active region, the method further comprising:
   introducing a first dopant material into the epitaxially-grown substrate material as the epitaxially-grown substrate material is grown on the epitaxial growth surface of the substrate layer to for the first active region, the epitaxially-grown substrate material comprising the first dopant material;
   etching the oxide layer provided on the substrate layer to form a third isolation region, the third isolation region defining a second epitaxial growth surface of the substrate layer for epitaxial growth of the substrate material on the second epitaxial growth surface between the second and third isolation regions, the second epitaxial growth surface of the substrate layer having been masked while the epitaxially-grown substrate material was grown and the first dopant material was introduced on the first epitaxial growth surface of the substrate layer; and
   epitaxially growing the substrate material on the second epitaxial growth surface of the substrate layer to form a second active region comprising the epitaxially-grown substrate material between the second and third isolation regions, the epitaxially-grown substrate material of the second active region comprising a second dopant material introduced into the epitaxially-grown substrate material as the epitaxially-grown substrate material is grown on the second epitaxial growth surface of the substrate layer while the first active region is masked.

4. The method of claim 1, wherein:
   the device comprises a complementary metal oxide semiconductor (CMOS) device; and
   the epitaxially-grown substrate material forms at least one of a p-type well and an n-type well underlying the active region.

5. The method of claim 1, further comprising a transistor, forming the transistor comprising:
   providing a pad layer on the active region;
   forming a gate on the pad layer;
   forming a substantially vertical isolation layer on each side of the gate, the substantially vertical isolation layers adapted to laterally isolate the gate; and
   epitaxially growing an extender on the active region on each side of the gate, the isolation layer on each side of the gate laterally isolating the gate from the corresponding extender, each extender comprising either a p-type material or an n-type material and adapted to serve as either a source or a drain for the transistor.

6. The method of claim 5, comprising forming the source and the drain of the transistor independent of any process for implanting either a p-type material or an n-type material into the active region.

7. The method of claim 5, wherein:
   the isolation layers formed on each side of the gate comprise first isolation layers each having a first height; and
   the extenders epitaxially grown on the active region on each side of the gate comprise first extenders each having a first length; the method further comprising:
      forming second substantially vertical isolation layers adjacent to the sides of the first isolation layers away from the gate and adapted to further isolate the gate, the second isolation layers each having a second height that is less than the first height of an adjacent first isolation layer; and
      epitaxially growing a second extender on the first extender on each side of the gate, each second extender comprising either a p-type material or an n-type material and adapted to serve as either a source or a drain for the transistor.

8. The method of claim 1, wherein the epitaxially-grown substrate material is grown to a height less than a height of the first and second isolation regions.

* * * * *